US009977062B2

(12) United States Patent
Inami et al.

(10) Patent No.: US 9,977,062 B2
(45) Date of Patent: May 22, 2018

(54) ELECTRIC FIELD INTENSITY CALCULATION PROGRAM, ELECTRIC FIELD INTENSITY CALCULATION APPARATUS AND ELECTRIC FIELD INTENSITY CALCULATION METHOD

(71) Applicants: FUJITSU TEN LIMITED, Kobe-shi, Hyogo (JP); FDK CORPORATION, Tokyo (JP)

(72) Inventors: Jun Inami, Kobe (JP); Katsuji Hirabayashi, Kobe (JP); Manabu Teranishi, Tokyo (JP)

(73) Assignees: FUJITSU TEN LIMITED, Kobe-shi (JP); FDK CORPORATION, Tokyo (JP)

( * ) Notice: Subject to any disclaimer, the term of this patent is extended or adjusted under 35 U.S.C. 154(b) by 123 days.

(21) Appl. No.: 15/116,030

(22) PCT Filed: Jul. 23, 2015

(86) PCT No.: PCT/JP2015/070985
§ 371 (c)(1),
(2) Date: Aug. 2, 2016

(87) PCT Pub. No.: WO2016/031451
PCT Pub. Date: Mar. 3, 2016

(65) Prior Publication Data
US 2017/0168101 A1 Jun. 15, 2017

(30) Foreign Application Priority Data
Aug. 27, 2014 (JP) .................................. 2014-172937

(51) Int. Cl.
*G01R 25/00* (2006.01)
*G01R 29/08* (2006.01)
(Continued)

(52) U.S. Cl.
CPC .......... *G01R 29/08* (2013.01); *G01R 29/0814* (2013.01); *G01R 31/002* (2013.01); *G01R 31/2817* (2013.01)

(58) Field of Classification Search
CPC ........................... G01R 29/08; G01R 29/0814
(Continued)

(56) References Cited

U.S. PATENT DOCUMENTS

| 8,385,748 B2* | 2/2013 | Kagaya | H01P 1/20345 385/88 |
| 8,773,107 B2* | 7/2014 | Jackson | G01R 29/0814 324/228 |
| 9,335,359 B2* | 5/2016 | Kurihara | G01R 29/0821 |

FOREIGN PATENT DOCUMENTS

JP H10-185973 A 7/1998

OTHER PUBLICATIONS

Sep. 29, 2015 Search Report issued in International Patent Application No. PCT/JP2015/070985.

* cited by examiner

*Primary Examiner* — An Do
(74) *Attorney, Agent, or Firm* — Oliff PLC

(57) ABSTRACT

An electric field intensity calculation apparatus specifies, by analyzing a measurement result for a near magnetic field intensity distribution on a component side of a printed circuit, a maximum intensity of an evaluation target frequency component of a near magnetic field of the printed circuit and an area of a range, on the printed circuit, delimited by using, as its boundary, positions where intensity of the evaluation target frequency component of the near magnetic field attenuates by a predetermined factor relative to the maximum intensity, and calculate a far electric field intensity for the evaluation target frequency at a place at a distance from the printed circuit, based on the area, an (Continued)

electronic current value of an electronic current that generates a near magnetic field having the maximum intensity when flowing through the component side of the printed circuit, the evaluation target frequency, the distance, and a proportional coefficient.

10 Claims, 10 Drawing Sheets

(51) Int. Cl.
     *G01R 31/00*      (2006.01)
     *G01R 31/28*      (2006.01)

(58) Field of Classification Search
     USPC .............................................. 702/57, 64, 65
     See application file for complete search history.

35: ELECTRIC FIELD INTENSITY CALCULATION PROGRAM

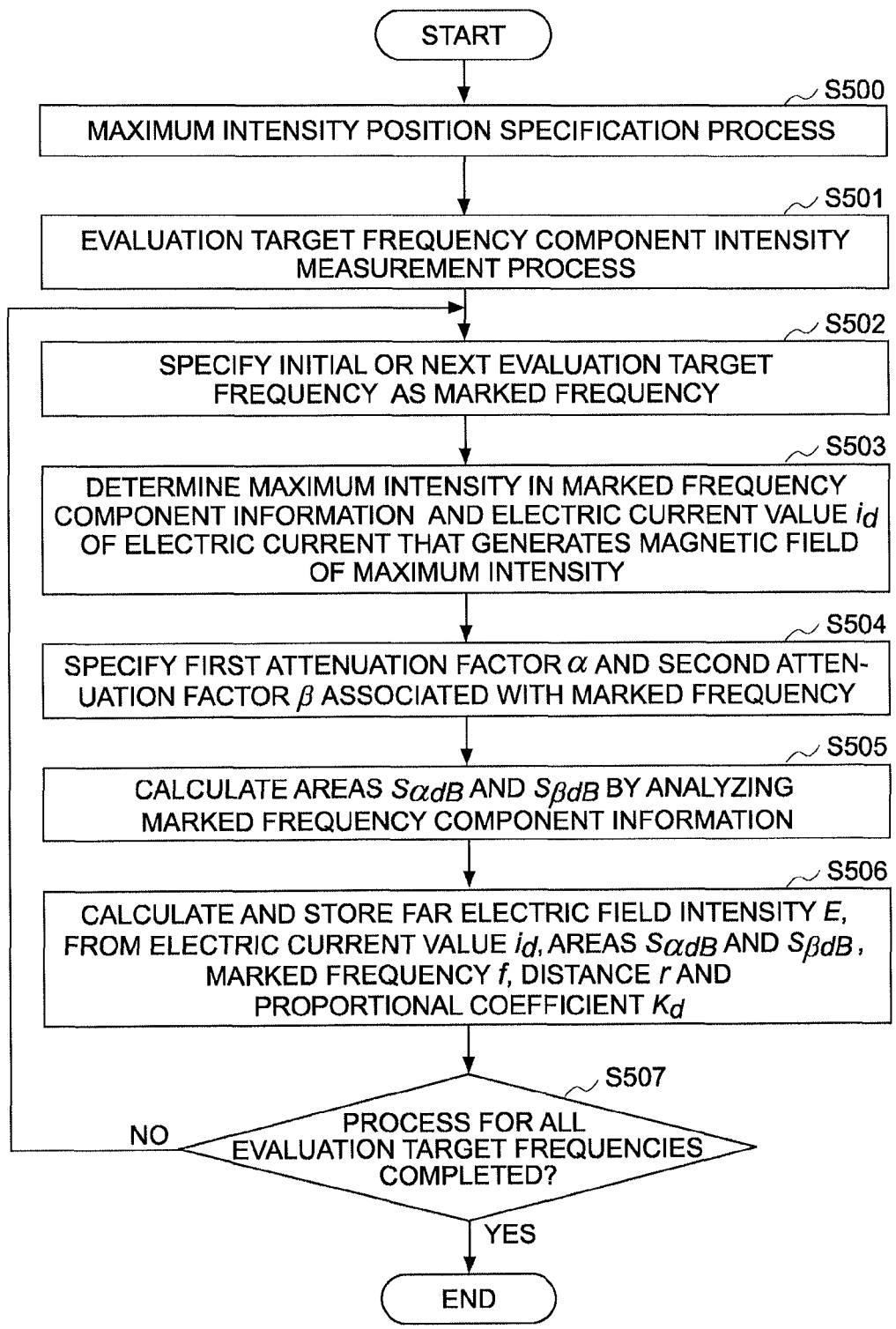

ELECTRIC FIELD INTENSITY CALCULATION PROGRAM, ELECTRIC FIELD INTENSITY CALCULATION APPARATUS AND ELECTRIC FIELD INTENSITY CALCULATION METHOD

TECHNICAL FIELD

The present invention relates to an electric field intensity calculation program, an electric field intensity calculation apparatus and an electric field intensity calculation method.

BACKGROUND ART

At the time of the development of a printed circuit, the far electric field intensity of the printed circuit is evaluated by an EMC (electromagnetic compatibility) test and, when the far electric field intensity is out of the standard, an EMC measure is performed, and thereafter, the far electric field intensity of the printed circuit is reevaluated by the EMC test. Further, as the EMC measures, a noise source for the printed circuit is specified by the measurement of electromagnetic wave intensity (electric field intensity and/or magnetic field intensity) in a near field, and a noise reduction measure is performed for the specified noise source.

At the time of the development of the printed circuit, the above is performed, and the far electric field intensity sometimes cannot be placed within the standard, without performing the EMC measure multiple times, in other words, unnecessary EMC tests are sometimes performed multiple times. The EMC test is a test for which a special large-size facility is necessary and which takes many steps to carry out it, and therefore, there have been proposed various technologies (for example, see Patent Literature 1) for calculating (estimating) the far electric field intensity from the measurement result for the electromagnetic wave intensity in the near field. However, in the existing status, there has still not been developed a technology that makes it possible to calculate the far electric field intensity of the printed circuit from the electromagnetic wave intensity of the printed circuit in the near field simply (in a manner in which a complex computation is not necessary).

CITATION LIST

Patent Literature

Patent Literature 1: Japanese Patent Laid-Open No. 10-185973

SUMMARY OF INVENTION

Technical Problem

The present invention has been made in view of the above existing status, and an object of the present invention is to provide a technology that makes it possible to simply calculate the far electric field intensity of the printed circuit, from the magnetic field intensity of the printed circuit in the near field.

Solution to Problem

For solving the above object, an electric field intensity calculation program in a first aspect of the present invention makes a computer function as:

a specification means for specifying, by analyzing a measurement result for a near magnetic field intensity distribution on a component side of a printed circuit, a maximum intensity of an evaluation target frequency component of a near magnetic field of the printed circuit and an area S1 of a range on the printed circuit which is delimited by using, as its boundary, positions where intensity of the evaluation target frequency component of the near magnetic field of the printed circuit attenuates by a first predetermined factor relative to the maximum intensity; and a calculation means for calculating a far electric field intensity E of the printed circuit, by a following calculation formula, using the area S1, an electric current value id, a distance r, an evaluation target frequency f and a previously set coefficient $K_d$, the far electric field intensity E being a far electric field intensity for the evaluation target frequency at a place that is distant by the distance r, the electric current value $i_d$ being an electric current value of electric current that generates a near magnetic field having the maximum intensity when flowing through the component side of the printed circuit.

$$E = K_d \cdot \frac{S1 \cdot i_d \cdot f^2}{r}$$

That is, each process that is performed by the specification means and the calculation means and that is actualized by the execution of the electric field intensity calculation program in the first aspect of the present invention by the computer is a process for which a complex computation is not necessary. Further, by experimental results, it has been confirmed that the far electric field intensity E (the unit is V/m) close to the actual measurement value in open area is calculated from the above calculation formula, for example, by adopting $K_d \approx 2.63 \times 10^{-14}$ and the first predetermined factor $\approx \frac{1}{2}$, when the unit of $i_d$ is A, the unit of S1 is m², the unit of f is Hz, and the board of the printed circuit is a single-layer board. Therefore, in the case of using the electric field intensity calculation program in the first aspect of the present invention, it is possible to simply calculate the far electric field intensity of the printed circuit whose board is a single-layer board, from the magnetic field intensity of the printed circuit in the near field.

Further, an electric field intensity calculation program in a second aspect of the present invention makes a computer function as:

a specification means for specifying, by analyzing a measurement result for a near magnetic field intensity distribution on a component side of a printed circuit, a maximum intensity of an evaluation target frequency component of a near magnetic field of the printed circuit, an area S1 of a range on the printed circuit which is delimited by using, as its boundary, positions where intensity of the evaluation target frequency component of the near magnetic field of the printed circuit attenuates by a first predetermined factor relative to the maximum intensity and an area S2 of a range on the printed circuit which is delimited by using, as its boundary, positions where intensity of the evaluation target frequency component of the near magnetic field of the printed circuit attenuates by a second predetermined factor relative to the maximum intensity; and a calculation means for calculating a far electric field intensity E of the printed circuit, by a following calculation formula, using the area S1, the area S2, an electric current value $i_d$, a distance r, an evaluation target frequency f and a previously set coefficient $K_d$, the far electric field intensity E being a far electric field intensity for the evaluation target frequency at a place that is distant by the distance r, the electric current value $i_d$ being an electric current value of electric current that generates a near magnetic field having the maximum intensity when flowing through the component side of the printed circuit.

$$E = K_d \cdot \frac{(S1+S2) \cdot i_d \cdot f^2}{r}$$

That is, each process that is performed by the specification means and the calculation means and that is actualized by the execution of the electric field intensity calculation program in the second aspect of the present invention by the computer is a process for which a complex computation is not necessary. Further, by experimental results, it has been confirmed that the far electric field intensity E (the unit is V/m) close to the actual measurement value in open area is calculated from the above calculation formula, for example, by adopting $K_d \approx 2.63 \times 10^{-14}$, the first predetermined factor $\approx 1/2$ and the second predetermined factor $\approx 1/4$, when the unit of $i_d$ is A, the unit of S1, S2 is m², the unit of f is Hz, and the board of the printed circuit is a multi-layer board. Therefore, in the case of using the electric field intensity calculation program in the second aspect of the present invention, it is possible to simply calculate the far electric field intensity of the printed circuit whose board is a multi-layer board, from the magnetic field intensity of the printed circuit in the near field.

The electric field intensity calculation program in the second aspect of the present invention may be created (programed) such that the specification means is means for specifying the maximum intensity, the area S1 and the area S2 for each of multiple evaluation target frequencies that are different from each other, and the calculation means is means for calculating the far electric field intensity E, using the calculation formula, for each of the multiple evaluation target frequencies.

Further, the electric field intensity calculation program in the second aspect of the present invention may be created such that the specification means is means for specifying the area S1 and the area S2, using a pair of values associated with the evaluation target frequency as the first predetermined factor and the second predetermined factor, for each of multiple evaluation target frequencies that are different from each other, and the calculation means is means for calculating the far electric field intensity E, using the calculation formula, for each of the multiple evaluation target frequencies. Here, in the case of creating the electric field intensity program in the second aspect of the present invention such that each means is the above means, it is possible to calculate the far electric field intensity E particularly accurately.

Further, for enhancing the calculation accuracy for the far electric field intensity E in a low frequency region, the electric field intensity calculation program in the second aspect of the present invention may be a program further making the computer function as a "correction means for performing a correction by an amount appropriate for the evaluation target frequency, to the far electric field intensity E calculated by the calculation means for an evaluation target frequency that is lower than a predetermined frequency".

The electric field intensity calculation program in each aspect of the present invention may be a program further making the computer function as "control means for controlling a measurement apparatus that is connected with the computer and that measures the near magnetic field intensity distribution on the circuit side of the printed circuit, by changing a relative position of a near magnetic field probe to the printed circuit". Further, in the case where the electric field intensity calculation program in each aspect of the present invention is such a program, the control means can be means "for searching a spot that is on the printed circuit and where the intensity of the evaluation target frequency component of the near magnetic field is maximized, by controlling the measurement apparatus, before obtaining the measurement result for the near magnetic field intensity distribution on the component side of the printed circuit, and controlling the measurement apparatus such that near magnetic field intensities at multiple spots are measured by the near magnetic field probe, when obtaining the measurement result for the near magnetic field intensity distribution on the component side of the printed circuit, the multiple spots including the searched spot and being arrayed in a lattice pattern". Here, in the case of adopting such means as the control means, it is possible to prevent the decrease in the calculation accuracy for the far electric field intensity due to an inadequate position of a measurement point for the near magnetic field intensity.

An electric field intensity calculation apparatus in the present invention includes:

a specification means for specifying, by analyzing a measurement result for a near magnetic field intensity distribution on a component side of a printed circuit, a maximum intensity of an evaluation target frequency component of a near magnetic field of the printed circuit, an area S1 of a range on the printed circuit which is delimited by using, as its boundary, positions where intensity of the evaluation target frequency component of the near magnetic field of the printed circuit attenuates by a first predetermined factor relative to the maximum intensity and an area S2 of a range on the printed circuit which is delimited by using, as its boundary, positions where intensity of the evaluation target frequency component of the near magnetic field of the printed circuit attenuates by a second predetermined factor relative to the maximum intensity; and a calculation means for calculating a far electric field intensity E of the printed circuit, by a following calculation formula, using the area S1, the area S2, an electric current value $i_d$, a distance r, an evaluation target frequency f and a previously set coefficient $K_d$, the far electric field intensity E being a far electric field intensity for the evaluation target frequency at a place that is distant by the distance r, the electric current value $i_d$ being an electric current value of electric current that generates a near magnetic field having the maximum intensity when flowing through the component side of the printed circuit.

$$E = K_d \cdot \frac{(S1+S2) \cdot i_d \cdot f^2}{r}$$

Further, an electric field intensity calculation method in the present invention makes a computer execute:

a step of specifying, by analyzing a measurement result for a near magnetic field intensity distribution on a component side of a printed circuit, a maximum intensity of an evaluation target frequency component of a near magnetic field of the printed circuit, an area S1 of a range on the printed circuit which is delimited by using, as its boundary, positions where intensity of the evaluation target frequency component of the near magnetic field of the printed circuit attenuates by a first predetermined factor relative to the maximum intensity and an area S2 of a range on the printed circuit which is delimited by using, as its boundary, positions where intensity of the evaluation target frequency component of the near magnetic field of the printed circuit attenuates by a second predetermined factor relative to the maximum intensity; and a step of calculating a far electric field intensity E of the printed circuit, by a following calculation formula, using the area S1, the area S2, an electric current value $i_d$, a distance r, an evaluation target frequency f and a previously set coefficient $K_d$, the far electric field intensity E being a far electric field intensity for the evaluation target frequency at a place that is distant by the distance r, the electric current value $i_d$ being an electric current value of electric current that generates a near magnetic field having the maximum intensity when flowing through the component side of the printed circuit, and thereby, the far electric field intensity is calculated.

$$E = K_d \cdot \frac{(S1 + S2) \cdot i_d \cdot f^2}{r}$$

Therefore, according to the electric field intensity calculation apparatus/method in the present invention, it is possible to simply calculate the far electric field intensity of the printed circuit whose board is a multi-layer board, from the magnetic field intensity of the printed circuit in the near field.

Advantageous Effect of Invention

According to the present invention, it is possible to simply calculate the far electric field intensity of a printed circuit, from the magnetic field intensity of the printed circuit in the near field.

BRIEF DESCRIPTION OF DRAWINGS

FIG. 10 is a flowchart of a measurement calculation process that is executed by a computation apparatus of an electric field intensity calculation system according to a fifth embodiment of the present invention.

DESCRIPTION OF EMBODIMENTS

Hereinafter, embodiments of the present invention will be described with reference to the drawings.

First Embodiment

Figure 1:
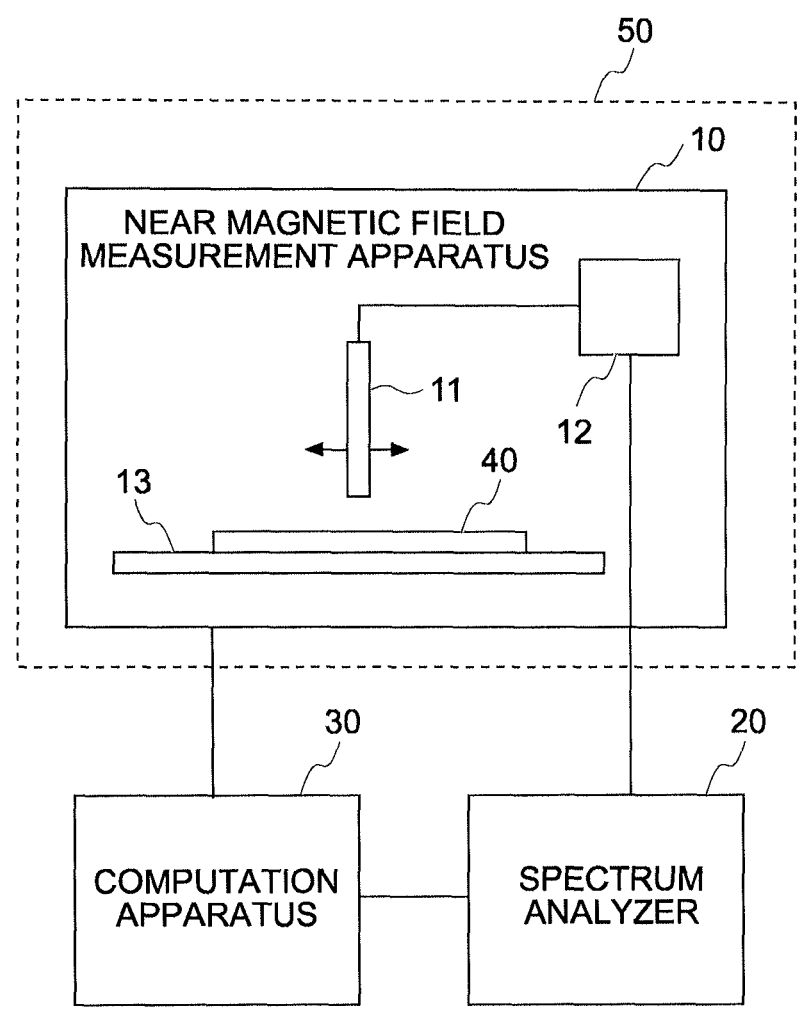
FIG. 1 is a block diagram of an electric field intensity calculation system according to a first embodiment of the present invention.

FIG. 1 illustrates a schematic constitution of an electric field intensity calculation system according to a first embodiment of the present invention.

The electric field intensity calculation system according to the embodiment has been developed as a system for calculating the far electric field intensity of a printed circuit 40 in which a single-layer board (single-sided board) is used. As illustrated, the electric field intensity calculation system includes a near magnetic field measurement apparatus 10, a spectrum analyzer 20, and a computation apparatus 30.

The near magnetic field measurement apparatus 10 is an apparatus for measuring the near magnetic field distribution of the printed circuit 40. The near magnetic field measurement apparatus 10 includes a table 13 on which the printed circuit 40 is placed, a near magnetic field probe 11, a preamplifier 12 for amplifying the output of the near magnetic field probe 11, and a position control mechanism (illustration is omitted) for controlling (changing) the position of the near magnetic field probe 11 relative to the table 13.

Here, the illustrated near magnetic field measurement apparatus 10 is an apparatus that is installed and used in a shield room or an anechoic chamber 50 and in which the near magnetic field probe 11 moves above the table 13, but the near magnetic field measurement apparatus 10 may be an apparatus including a housing that functions as an anechoic chamber. Further, the near magnetic field measurement apparatus 10 may be an apparatus in which the near magnetic field probe 11 is fixed to a housing of the apparatus and in which the table 13 moves below the near magnetic field probe 11.

The near magnetic field probe 11 of the near magnetic field measurement apparatus 10, for example, is a probe that includes a shielded loop coil at the head part. The near magnetic field probe 11 may be a probe that measures the magnetic field intensity in a direction parallel to the board of the printed circuit 40, or may be a probe that measures the magnetic field intensity in a direction perpendicular to the board of the printed circuit 40. Here, in the case where the near magnetic field probe 11 is a probe that measures the magnetic field intensity in the direction parallel to the board of the printed circuit 40, it is preferable that the position control mechanism of the near magnetic field measurement apparatus 10 can rotate the near magnetic field probe 11 (or the table 13).

Further, the component side of the printed circuit 40 has different heights depending on the place (the presence or absence of a component). Moreover, when the interval between the upper surface of the printed circuit 40 and the near magnetic field probe 11 is constant, it is possible to measure the near magnetic field intensity more exactly. Therefore, as the near magnetic field measurement apparatus 10, it is allowable to employ an apparatus that includes a laser range finder to measure the height of the component side of the printed circuit 40 and in which the height of the near magnetic field probe 11 is automatically controlled based on the measurement result of the laser range finder such that the interval between the upper surface of the printed circuit 40 and the near magnetic field probe 11 is constant.

The spectrum analyzer 20 is an apparatus for performing the frequency analysis for the near magnetic field intensity measured by the near magnetic field probe 11. As the spectrum analyzer 20 (hereinafter, also referred to as the SPA 20), for example, a spectrum analyzer that can perform the frequency analysis in a range of about several MHz to 1000 MHz is used.

Figure 2:
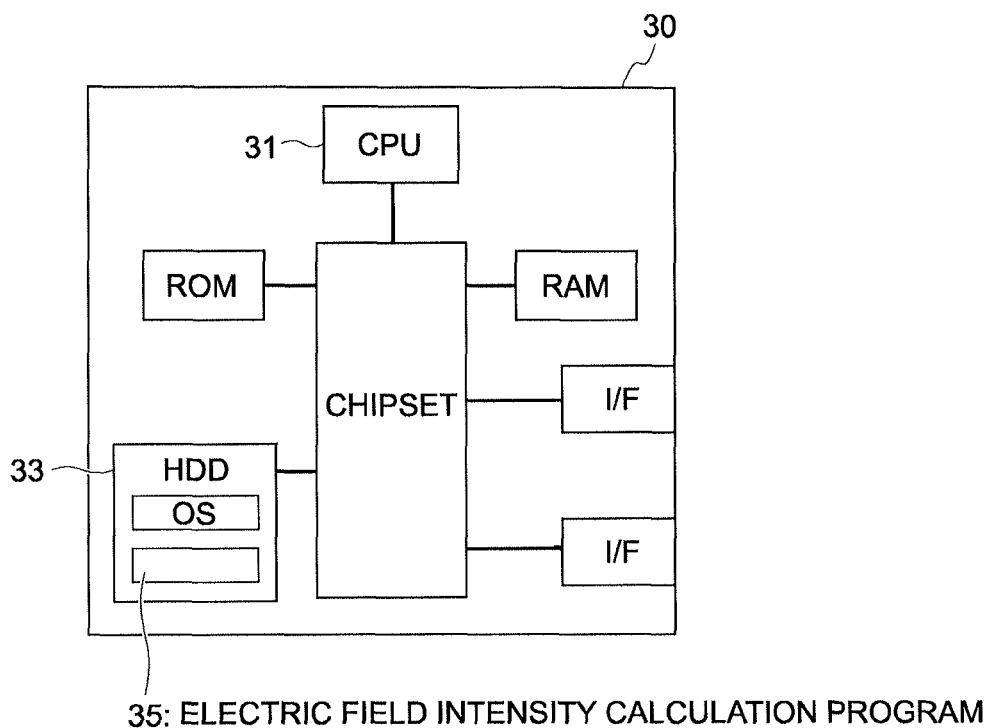
FIG. 2 is a block diagram of a computation apparatus that is included in the electric field intensity calculation system according to the first embodiment.

As schematically illustrated in FIG. 2, the computation apparatus 30 is an apparatus actualized by installing an electric field intensity calculation program 35 in a computer which includes a CPU 31, a ROM, a RAM, an HDD 33 and the like, and in which an OS (operating system) and various drivers have been installed. The computer in which the electric field intensity calculation program 35 is installed may be a laptop computer, or may be a desktop computer, as long as including an interface (for example, a GPIB interface) for communicating between the near magnetic field measurement apparatus 10 and the spectrum analyzer 20. Further, typically, the installation of the electric field intensity calculation program 35 in the computer is performed from a removable recording medium such as a CD-ROM (compact disc read-only memory) and a DVD (digital versatile disc).

In the following, the operation of the computation apparatus 30 when the CPU 31 executes the electric field intensity calculation program 35 (and the OS) will be described. Note that, in the following description, a user means an operator of the electric field intensity calculation system.

The computation apparatus 30 in which the CPU 31 executes the electric field intensity calculation program 35 operates as an apparatus that can execute a setting acceptance process, a measurement calculation process and an output process. Each of the setting acceptance process, the measurement calculation process and the output process is a process that the computation apparatus 30 starts when the user gives the instruction of the execution. The computation apparatus 30 after starting each process operates as follows.

<Setting Acceptance Process>

The computation apparatus 30 after starting the setting acceptance process enters a state of accepting the setting (input) of the following information.

Measurement range of near magnetic field

Measurement interval of near magnetic field

One or more frequencies (hereinafter, referred to as evaluation target frequencies) for which the far electric field intensity is calculated Distance r (the unit is m) of the calculation position of the far electric field intensity from the evaluation target printed circuit 40

The measurement range of the near magnetic field to be set by the user is the information to designate the scan range of the near magnetic field probe 11 at the time of the measurement calculation process (the detail will be described later), as the coordinate range of a range that is on the table 13 and where the evaluation target printed circuit 40 is placed. The measurement interval of the near magnetic field is the information to designate the movement amounts of the near magnetic field probe 11 in the X and Y directions for each measurement at the time of the measurement calculation process. When the measurement interval is excessively wide, it is not possible to exactly measure the near magnetic field distribution of the evaluation target printed circuit 40. Therefore, typically, the measurement interval is set to a value comparable to the spatial resolution (half width at half maximum) of the near magnetic field probe 11. Specifically, when the spatial resolution of the near magnetic field probe 11 is 1 mm, the measurement interval is set to $2^{1/2}$ mm, for example.

When the user gives the instruction of the completion of the setting, the computation apparatus 30 stores the information including a variety of information set by the user, as current evaluation condition information, in the interior (in the RAM and/or HDD 33 within the computation apparatus 30), and then, ends the setting acceptance process.

<Output Process>

The computation apparatus 30 after starting the output process displays a graph indicating the evaluation target frequency dependency of the far electric field intensity, on a display, based on the processing result of the measurement calculation process described later. Thereafter, in accordance with the instruction by the user, the computation apparatus 30 performs a process of printing the graph with a printer connected with the computation apparatus 30, a process of displaying a list of the far electric field intensity for each evaluation target frequency on the display, and the like. Then, when the user gives the instruction of the process end, the computation apparatus 30 ends the output process, and enters a state of accepting the instruction of the execution of another process.

<Measurement Calculation Process>

Figure 3:
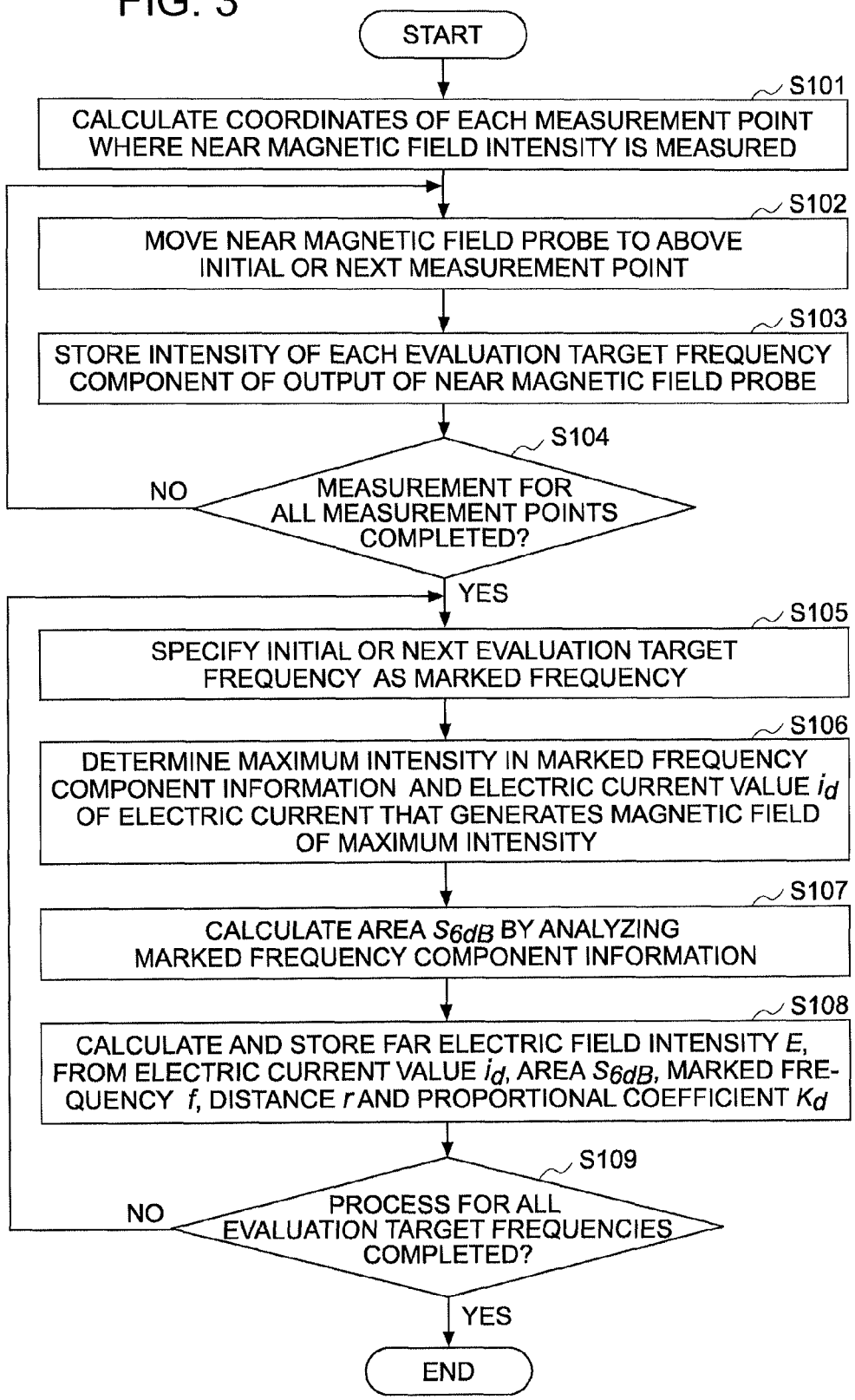
FIG. 3 is a flowchart of a measurement calculation process that is executed by the computation apparatus of the electric field intensity calculation system according to the first embodiment.

The measurement calculation process is a process with a procedure illustrated in FIG. 3.

That is, the computation apparatus 30 having started the measurement calculation process, to begin with, calculates the coordinates of each measurement point (measurement position) where the measurement of the near magnetic field intensity is performed, based on the measurement range and measurement interval of the near magnetic field in the current evaluation condition information (step S101).

Next, the computation apparatus 30 controls the near magnetic field intensity measurement apparatus 10, using the coordinates of the initial measurement point, and thereby, moves the near magnetic field probe 11 to above the initial measurement point (step S102).

Thereafter, the computation apparatus 30 acquires the intensity of each evaluation target frequency component of the output of the near magnetic field probe 11, from the SPA 20, and internally store it in association with the evaluation target frequency and the coordinates of the current measurement point (step S103). The process of step S103 may be a process of evaluating the intensity of each evaluation target frequency component of the near magnetic field in multiple directions (for example, two orthogonal directions, or four directions different by 45 degrees) by rotating the near magnetic field probe 11 and storing the average value or maximum value of the evaluated intensity.

The computation apparatus 30 having finished the process of step S103 judges whether or not the measurement for all measurement points is completed (step S104). Then, in the case where the measurement for all measurement points is not completed (step S104: NO), the computation apparatus 30 returns to step S102 to move the near magnetic field probe 11 to above the next measurement point, and then, performs the processes of step S103 and later.

The computation apparatus 30 repeats the processes having the above contents until the measurement (the processes of steps S102 and S103) for all measurement points is completed.

Then, in the case where the measurement for all measurement points is completed (step S104: YES), the computation apparatus 30 starts processes for calculating the far electric field intensity (processes of step S105 and later), and first, specifies the initial evaluation target frequency in the current evaluation condition information, as a marked frequency (step S105). Note that, as the selection algorithm for the initial evaluation target frequency in step S105, any selection algorithm may be adopted. Therefore, the process of step S105 may be a process of selecting the minimal evaluation target frequency as the initial evaluation target frequency, or may be a process of selecting the maximal evaluation target frequency as the initial evaluation target frequency.

The computation apparatus 30 having finished the process of step S105 performs a process (step S106) of evaluating the maximum intensity in the marked frequency component information and evaluating the electric current value $i_d$ (the unit is A) of the electric current that generates the magnetic field at the maximum intensity when flowing through the component side of the evaluation target printed circuit 30. Here, the marked frequency component information is the information including the coordinates of multiple measurement points and the intensity of the marked frequency component of the near magnetic field of the evaluation target printed circuit 40 that is measured at each measurement point (which is a part of the information stored in the computation apparatus 30 by the process of step S103). Therefore, the maximum intensity in the marked frequency component information is the maximum value of the intensities of the marked frequency component of the near magnetic field that are measured for the evaluation target printed circuit 40.

Thereafter, by analyzing the marked frequency component information, the computation apparatus 30 calculates the area $S_{6\ dB}$ (the unit is m²) of a range that is delimited by using positions where the intensity of the marked frequency component of the near magnetic field attenuates by 6 dB relative to the maximum intensity as a boundary (step S107). The specific content of the process of step S107 is not particularly limited. For example, the process of step S107 may be a process of finding measurement points at each of which the intensity of the marked frequency component of the near magnetic field is a value in a predetermined range centered on an intensity of one half of the maximum intensity (an intensity that attenuates by 6 dB relative to the maximum intensity) from the marked frequency component information and calculating the area of a range surrounded by the specified measurement points as $S_{6\ dB}$. Further, the process of step S107 may be a process of finding the above measurement points from the marked frequency component information, specifying multiple points at each of which the intensity of the marked frequency component of the near magnetic field is one half of the maximum intensity, from the intensities of the marked frequency component for the found measurement points and the coordinates of the measurement points, by the interpolation method, and calculating the area of a range surrounded by the specified points as $S_{6\ dB}$.

The computation apparatus 30 having finished the process of step S107 calculates a far electric field intensity E, by substituting $i_d$ calculated by the process of step S106, $S_{6\ dB}$ calculated by the process of step S107, the set distance r and the marked frequency f into the following Formula (1) (step S108). Then, the computation apparatus 30 internally stores the calculated far electric field intensity E in association with the marked frequency at that time point (step S108).

$$E = K_d \cdot \frac{S_{6dB} \cdot i_d \cdot f^2}{r} \quad (1)$$

Note that, the unit of the marked frequency f is Hz. Further, the far electric field intensity E calculated by Formula (1) is the electric field intensity (the unit is V/m) at a place that is distant by r [m] from the printed circuit 40 in a direction parallel to the board surface of the printed circuit 40. Furthermore, $K_d$ in Formula (1) is a previously set proportional coefficient. For determining the far electric field intensity E in open area, 2.63×10⁻¹⁴ is typically used as $K_d$. However, by using 1.316×10⁻¹⁴ as $K_d$, the far electric field intensity E in free space may be evaluated.

Here, the reason why the computation apparatus 30 is configured (programed) as an apparatus that calculates the far electric field intensity E by the above procedure (the processes of steps S106 to S108 of the above contents) is described.

There is known a method of calculating the far electric field intensity of a printed circuit by the following Formula (2), assuming that a minute loop along which electric current flows is present on the board of the printed circuit.

$$E = K_d \cdot \frac{A \cdot i_{dm} \cdot f^2}{r} \quad (2)$$

For calculating the far electric field intensity of the printed circuit using Formula (2), it is necessary to evaluate the area A of the minute loop present on the board of the printed circuit and the magnitude $i_{dm}$ of the electric current to flow along the minute loop. However, it is extremely difficult to determine those values from the measurement result for the near magnetic field of the printed circuit. Therefore, the inventors diligently searched values that can be used instead of those values and that are evaluated from the measurement result for the near magnetic field of the printed circuit. As a result, it was found that the far electric field intensity close to the actual measurement value is obtained in the printed circuit 40 in which a single-layer board is used, in the case of using the above area $S_{6\ dB}$ and electric current value $i_d$ instead of A and $i_{dm}$. Therefore, the computation apparatus 30 is configured as an apparatus that calculates the far electric field intensity E by the above procedure.

In the following, the content of the residual step of the measurement calculation process (FIG. 3) will be described.

The computation apparatus 30 having finished the process of step S108 judges whether or not the process for all evaluation target frequencies is completed (step S109). In the case where the process for all evaluation target frequencies is not completed (step S109: NO), the computation apparatus 30 returns to step S105 to specify the next evaluation target frequency as the marked frequency, and then, performs the processes of step S106 and later.

Then, when the process for all evaluation target frequencies is completed (step S109: YES), the computation apparatus 30 ends the measurement calculation process (the process of FIG. 3), and enters a state of accepting the instruction of the execution of the output process or the setting acceptance process.

As described above, the electric field intensity calculation system according to the embodiment can calculate (estimate) the far electric field intensity of the printed circuit 40, from the measurement result for the near magnetic field of the printed circuit 40 (in which a single-layer board is used). Therefore, in the case where the printed circuit 40 after an EMC measure is evaluated by the electric field intensity calculation system according to the embodiment, it is possible to judge whether or not an EMC measure should be further performed for the printed circuit 40 after the EMC measure, without performing an EMC test.

Therefore, in the case of using the electric field intensity calculation system according to the embodiment, it is possible to prevent an EMC test having many evaluation steps from being unnecessarily performed, for example, at the time of the development of the printed circuit 40 in which a single-layer board is used.

Second Embodiment

In the following, the constitution and function of an electric field intensity calculation system according to a second embodiment of the present invention will be described, using the same reference numerals as those used in the description of the electric field intensity calculation system according to the first embodiment.

The electric field intensity calculation system according to the embodiment has been developed as a system to calculate the far electric field intensity of a printed circuit 40 in which a multi-layer board is used (a printed circuit in which components are mounted on both sides, or the like).

Figure 4:
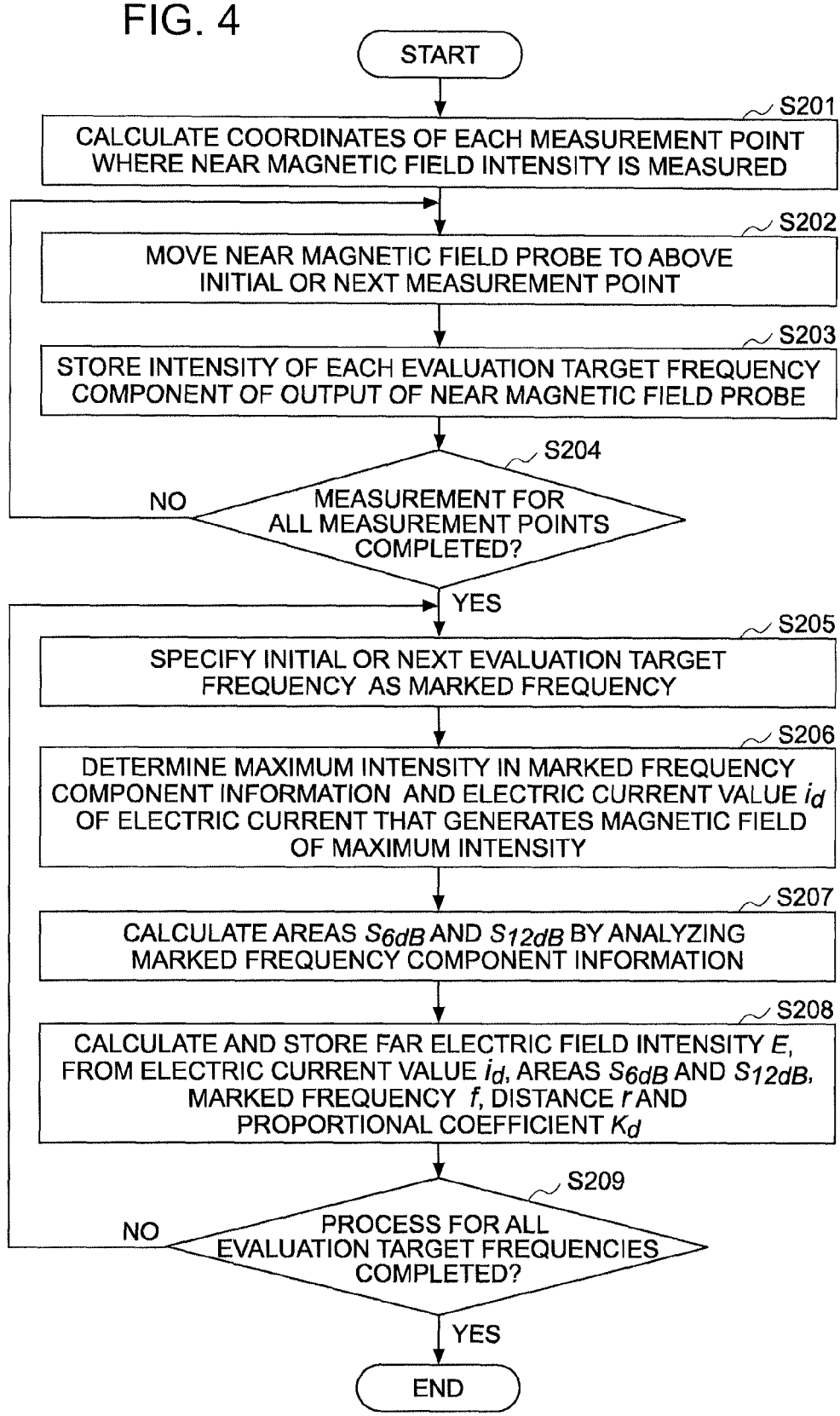
FIG. 4 is a flowchart of a measurement calculation process that is executed by a computation apparatus of an electric field intensity calculation system according to a second embodiment of the present invention.

The constitution and function of each unit of the electric field intensity calculation system according to the embodiment are essentially the same as the constitution and function of each unit of the electric field intensity calculation system according to the first embodiment. However, a computation apparatus 30 of the electric field intensity calculation system according to the embodiment is configured (programed) so as to be able to execute a measurement calculation process with a procedure illustrated in FIG. 4.

The processes of steps S201 to S204 of the measurement calculation process each are processes having the same contents as the processes (see FIG. 3) of steps S101 to S104 described already. That is, in steps S201 to S204, there is performed a process of moving the near magnetic field probe 11 to above each measurement point on the evaluation target printed circuit 40 and measuring and storing the intensity of each evaluation target frequency component of the output of the near magnetic field probe 11 moved to above each measurement point.

When the above process is completed (step S204: YES), the computation apparatus 30 starts processes for calculating the far electric field intensity (processes of steps S205 and later). Then, the computation apparatus 30 specifies the initial evaluation target frequency as the marked frequency (step S205), and then, determines the maximum intensity in the marked frequency component information and the electric current value $i_d$ (the unit is A) of the electric current that generates the magnetic field at the maximum intensity (step S206).

Thereafter, by analyzing the marked frequency component information, the computation apparatus 30 calculates the area $S_{6\ dB}$ (the unit is m$^2$) of a range that is delimited using positions where the intensity of the marked frequency component of the near magnetic field attenuates by 6 dB relative to the maximum intensity as a boundary (step S207). Furthermore, in step S207, by analyzing the marked frequency component information, the computation apparatus 30 performs also a process of calculating the area $S_{12\ dB}$ (the unit is m$^2$) of a range that is delimited by using positions where the intensity of the marked frequency component of the near magnetic field attenuates by 12 dB relative to the maximum intensity as a boundary.

Note that, similarly to the process of step S107, the content of the process of step S207 also is not particularly limited. Therefore, the process of step S207 may be a process of finding measurement points at each of which the intensity of the marked frequency component of the near magnetic field is a value in a predetermined range centered on a value of one half or one quarter of the maximum intensity from the marked frequency component information and calculating the area of a range surrounded by the specified measurement points as $S_{6\ dB}$ or $S_{12\ dB}$. Further, the process of step S207 may be a process of finding the above measurement points from the marked frequency component information, specifying multiple points at each of which the intensity of the marked frequency component of the near magnetic field is a value of one half or one quarter of the maximum intensity, from the intensities of the marked frequency component for the found measurement points and the coordinates of the measurement points, by the interpolation method, and calculating the area of a range surrounded by the specified points as $S_{6\ dB}$ or $S_{12\ dB}$.

The computation apparatus 30 having finished the process of step S207 calculates the far electric field intensity E (the unit is V/m), by substituting $i_d$ calculated by the process of step S206, $S_{6\ dB}$ and $S_{12\ dB}$ calculated by the process of step S207, the set distance r and the marked frequency f (the unit is Hz) into the following Formula (3) (step S208). Further, the computation apparatus 30 internally stores the calculated far electric field intensity E in association with the marked frequency at that time point (step S208).

$$E = K_d \cdot \frac{(S_{6dB} + S_{12dB}) \cdot i_d \cdot f^2}{r} \quad (3)$$

Similarly to $K_d$ in Formula (1), 2.63×10$^{-14}$ is typically used as $K_d$ in Formula (3), for determining the far electric field intensity E in open area. However, by using 1.316× 10$^{-14}$ as $K_d$, the far electric field intensity E in free space may be determined.

The computation apparatus 30 having finished the process of step S208 judges whether or not the process for all evaluation target frequencies is completed (step S209). In the case where the process for all evaluation target frequencies is not completed (step S209: NO), the computation apparatus 30 returns to step S205 to specify the next evaluation target frequency as the marked frequency, and then, performs the processes of step S206 and later.

When the process for all evaluation target frequencies is completed (step S209: YES), the computation apparatus 30 ends the measurement calculation process (the process of FIG. 4). Then, the computation apparatus 30 enters a state of accepting the instruction of the execution of the output process or the setting acceptance process.

As is obvious from the above description, the computation apparatus 30 according to the present embodiment is an apparatus that calculates the far electric field intensity E, by using the sum "$S_{6\ dB}+S_{12\ dB}$" of the areas and the electric current value $i_d$ instead of A and $i_{dm}$ in Formula (2) respectively.

Figure 5:
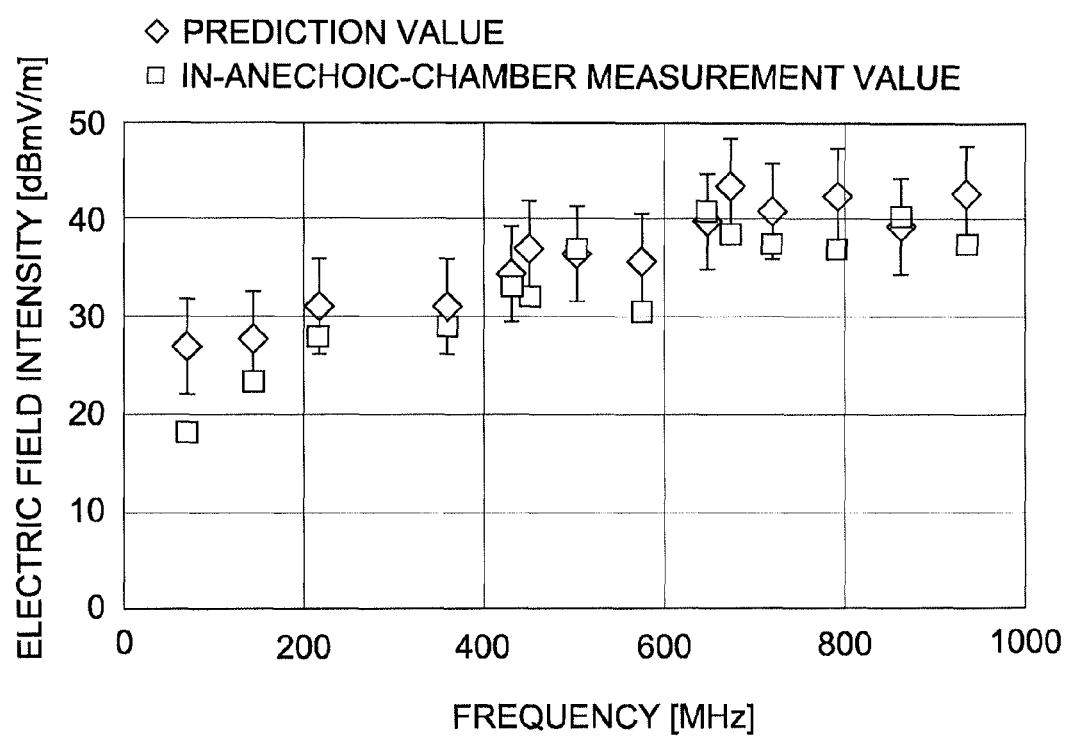
FIG. 5 is an explanatory diagram for the accuracy of far electric field intensity that is calculated by the electric field intensity calculation system according to the second embodiment.

The detail of a principle by which the far electric field intensity E can be accurately calculated by using the sum "$S_{6\ dB}+S_{12\ dB}$" of the areas and the electric current value $i_d$ instead of A and $i_{dm}$ in Formula (2) is not clear. However, as illustrated in FIG. 5, in the case of calculating the far electric field intensity E by the above procedure, it is possible to obtain, in a wide frequency range, the far electric field intensity E ("prediction value") that is different by only about ±5 dB from the actual measurement value ("in-anechoic-chamber measurement value").

Therefore, in the case of using the electric field intensity calculation system according to the embodiment, it is possible to prevent the EMC test having many evaluation steps from being unnecessarily performed, for example, at the time of the development of the printed circuit 40 in which a multi-layer board is used.

Third Embodiment

In the following, the constitution and function of an electric field intensity calculation system according to a third embodiment of the present invention will be described with a focus on differences from the electric field intensity calculation system according to the second embodiment.

As is obvious from FIG. 5, the electric field intensity calculation system according to the second embodiment is a system in which the calculation accuracy for the far electric field intensity in a low frequency region (a frequency region of approximately 100 MHz or lower) is not very high.

The electric field intensity calculation system according to the third embodiment is a system in which the electric field intensity calculation system according to the second embodiment is improved such that the calculation accuracy for the far electric field intensity in the low frequency region is high.

Figure 6:
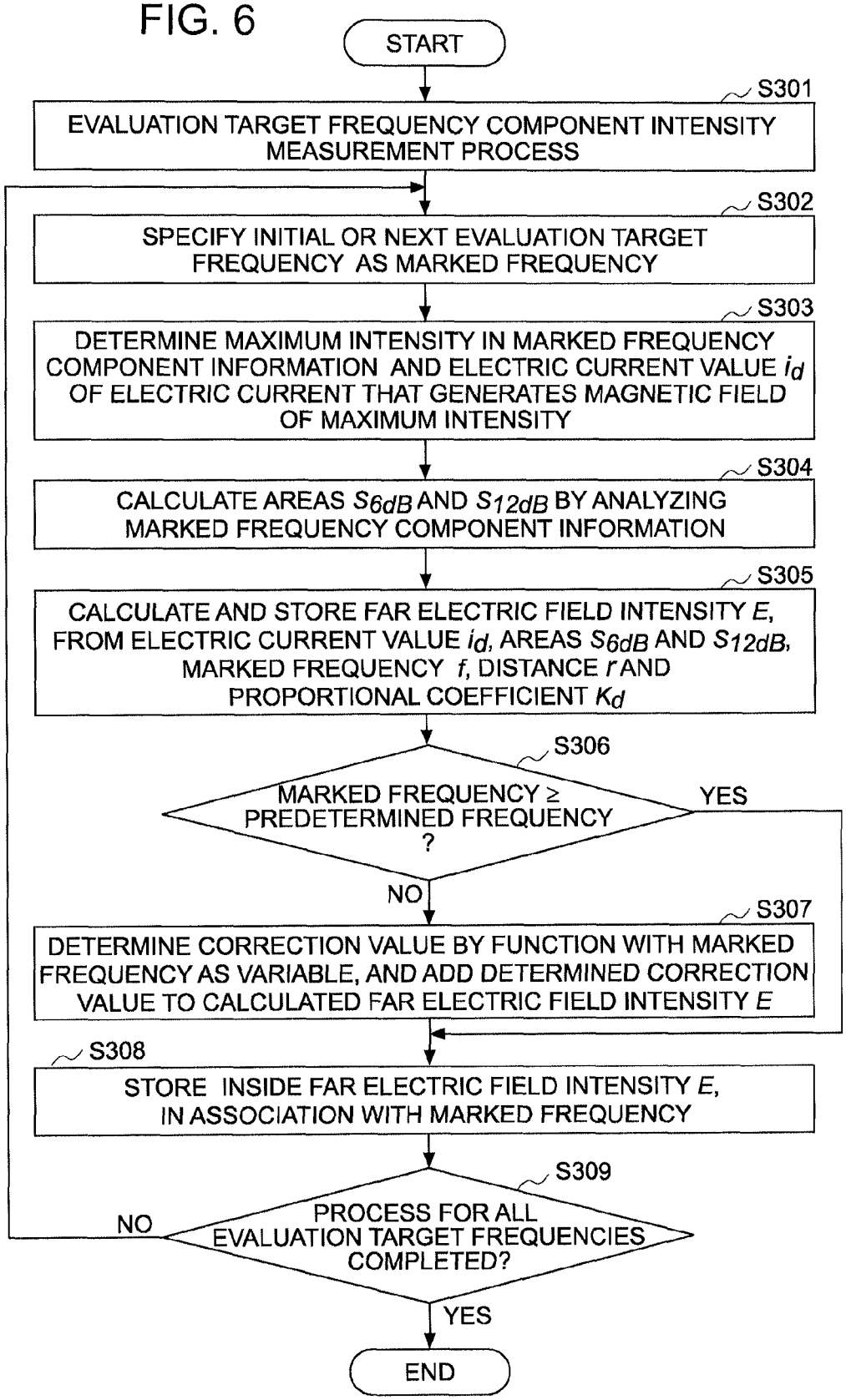
FIG. 6 is a flowchart of a measurement calculation process that is executed by a computation apparatus of an electric field intensity calculation system according to a third embodiment of the present invention.

Specifically, the electric field intensity calculation system according to the third embodiment is a system in which the electric field intensity calculation system according to the second embodiment is improved such that a computation apparatus 30 performs a measurement calculation process with a procedure illustrated in FIG. 6.

That is, after starting the measurement calculation process, the computation apparatus 30 of the electric field intensity calculation system according to the third embodiment, first, performs an evaluation target frequency component intensity measurement process (step S301). The evaluation target frequency component intensity measurement process is the same process as the process of steps S201 to S204 (see FIG. 4) that is performed by the computation apparatus 30 of the electric field intensity calculation system according to the second embodiment.

When the evaluation target frequency component intensity measurement is completed, the computation apparatus 30 starts processes for calculating the far electric field intensity (processes of step S302 and later). Then, in steps S302 to S304, the computation apparatus 30 performs processes having the same contents as the above processes of steps S205 to S207 respectively.

The computation apparatus 30 having finished the process of step S304 calculates the far electric field intensity E, by substituting $S_{6\ dB}$ and the like into the above Formula (3) (step S305). Next, the computation apparatus 30 judges whether the value of the marked frequency at that time point is a predetermined frequency or higher (step S306). Here, the predetermined frequency is a value (for example, 100 MHz) that is previously set as the lower limit value of a frequency range allowing the far electric field intensity E having a level at which the correction is unnecessary, to be calculated by Formula (3).

In the case where the value of the marked frequency is the predetermined frequency or higher (step S306: YES), the computation apparatus 30 internally stores the far electric field intensity E calculated in the process of step S305, with no change, in association with the marked frequency (step S308).

On the other hand, in the case where the value of the marked frequency is lower than the predetermined frequency (step S306: NO), the computation apparatus 30 evaluates a correction value by a function having the marked frequency as a variable (step S307). Then, the computation apparatus 30 adds the evaluated correction value to the far electric field intensity E calculated in the process of step S305 (step S307).

Figure 7:
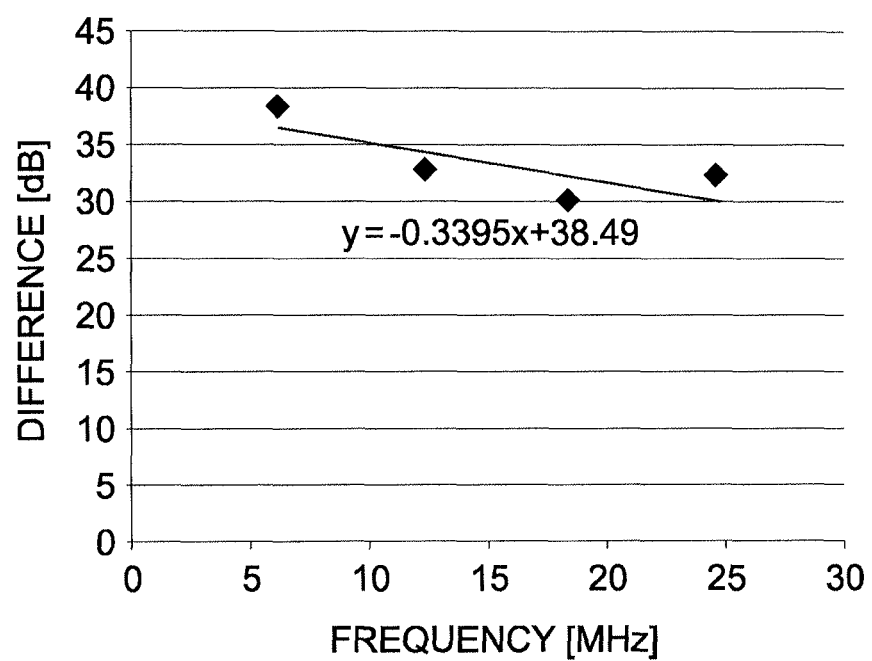
FIG. 7 is an explanatory diagram of a function that is used for the calculation of a correction amount, in the measurement calculation process of FIG. 6.

The function having, as a variable, the marked frequency to be used at the time of process of step S307 is a function for which the content (a coefficient and the like) is previously determined from the difference between the far electric field intensity E calculated by Formula (3) and the actual measurement value. This function may be any degree of function of the marked frequency. However, as illustrated in FIG. 7, it is found that the difference between the far electric field intensity E calculated by Formula (3) and the actual measurement value can be accurately approximated by a linear function "y=−0.3395x+38.49" with respect to the marked frequency (the value of the abscissa in FIG. 7). Therefore, as the "function having the marked frequency as a variable" in the process of step S307, it is possible to employ "−0.3395x+38.49" (x is the marked frequency, whose unit is MHz), or a function (for example, "−0.34x+38") by which a value comparable to that by the function is calculated.

Back to FIG. 6, the description of the measurement calculation process is continued.

The computation apparatus 30 after the process of step S307 stores, in the interior, the far electric field intensity E after the addition of the correction value, in association with the marked frequency (step S308). Thereafter, the computation apparatus 30 judges whether the process for all evaluation target frequencies is completed (step S309). In the case where the process for all evaluation target frequencies is not completed (step S309: NO), the computation apparatus 30 returns to step S302 to specify the next evaluation target frequency as the marked frequency, and then, performs the processes of step S303 and later.

Then, when the process for all evaluation target frequencies is completed (step S309: YES), the computation apparatus 30 ends the measurement calculation process, and enters a state of accepting the instruction of the execution of the output process or the setting acceptance process.

As is obvious from the above description, the computation apparatus 30 of the electric field intensity calculation system according to the embodiment is a system in which the calculation accuracy for the far electric field intensity E in a low frequency is higher than the above computation apparatus 30 of the electric field intensity calculation system according to the second embodiment.

Therefore, in the case of using the electric field intensity calculation system according to the embodiment, it is possible to prevent the EMC test from being unnecessarily performed, for example, at the time of the development of the printed circuit 40 in which a multi-layer board is used, more suitably than in the case of using the electric field intensity calculation system according to the second embodiment.

Fourth Embodiment

An electric field intensity calculation system according to a fourth embodiment of the present invention is a system in which the electric field intensity calculation system according to the second embodiment is improved such that the calculation accuracy for the far electric field intensity with respect to each frequency becomes higher.

Figure 8:
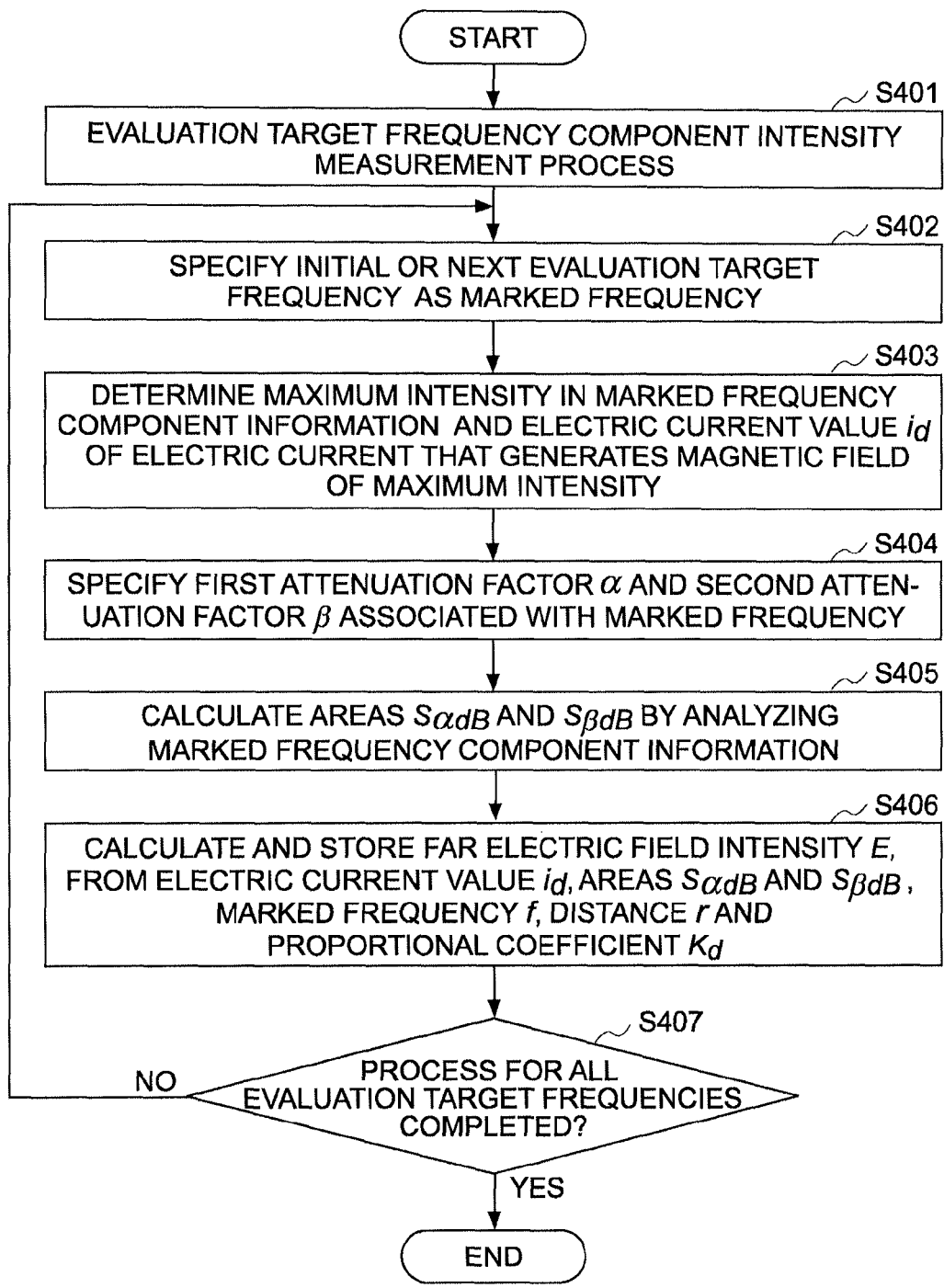
FIG. 8 is a flowchart of a measurement calculation process that is executed by a computation apparatus of an electric field intensity calculation system according to a fourth embodiment of the present invention.

Specifically, the electric field intensity calculation system according to the fourth embodiment is a system in which the electric field intensity calculation system according to the second embodiment is improved such that a computation apparatus 30 performs a measurement calculation process with a procedure illustrated in FIG. 8.

That is, after starting the measurement calculation process, the computation apparatus 30 of the electric field intensity calculation system according to the fourth embodiment, first, performs an evaluation target frequency component intensity measurement process (step S401). The evaluation target frequency component intensity measurement process is the same process as the evaluation target frequency component intensity measurement process that is performed by the computation apparatus 30 of the electric field intensity calculation system according to the third embodiment or the process of steps S201 to S204 that is performed by the computation apparatus 30 of the electric field intensity calculation system according to the second embodiment.

When the evaluation target frequency component intensity measurement is completed, the computation apparatus 30 starts processes for calculating the far electric field intensity (processes of step S402 and later), and first, in step S402, performs processes having the same contents as the above processes of steps S105, S205 and S302. In the subsequent step S403, the computation apparatus 30 performs processes having the same contents as the processes of steps S106, S206 and S303.

Thereafter, by referring to the correspondence relation prescription information that prescribes the correspondence relation among the marked frequency, a first attenuation factor $\alpha$ and a second attenuation factor $\beta$, the computation apparatus 30 specifies the first attenuation factor $\alpha$ and the second attenuation factor $\beta$ associated with the marked frequency at that time point (step S404). Next, by the analysis of the marked frequency component information, the computation apparatus 30 performs a process (step S405) of calculating an area $S_{\alpha dB}$ and an area $S_{\beta dB}$. The detail of the correspondence relation prescription information will be described later. The correspondence relation prescription information may be information in the program 35, or may be information in the HDD 33. Further, the detail of the first attenuation factor $\alpha$ and the second attenuation factor $\beta$ will be described later. The area $S_{XdB}$ ($X=\alpha, \beta$) is the area (the unit is m$^2$) of a range that is delimited by adopting, as a border, a position where the intensity of the marked frequency component of the near magnetic field attenuates by XdB relative to the maximum intensity.

The computation apparatus 30 after the process of step S405 calculates the far electric field intensity E, by substituting the calculated $S_{\alpha dB}$ and $S_{\beta dB}$, and the like, into the following Formula (4), and stores it in the interior, in association with the marked frequency (step S406).

$$E = K_d \cdot \frac{(S_{\alpha dB} + S_{\beta dB}) \cdot i_d \cdot f^2}{r} \quad (4)$$

The above correspondence relation prescription information to be referenced at the time of the process of step S404 is the information whose content is determined so as to allow for the specification of a combination of the first attenuation factor $\alpha$ and the second attenuation factor $\beta$ by which the far electric field intensity E calculated by Formula (4) roughly coincides with the actual measurement value of the far electric field intensity.

Figure 9:
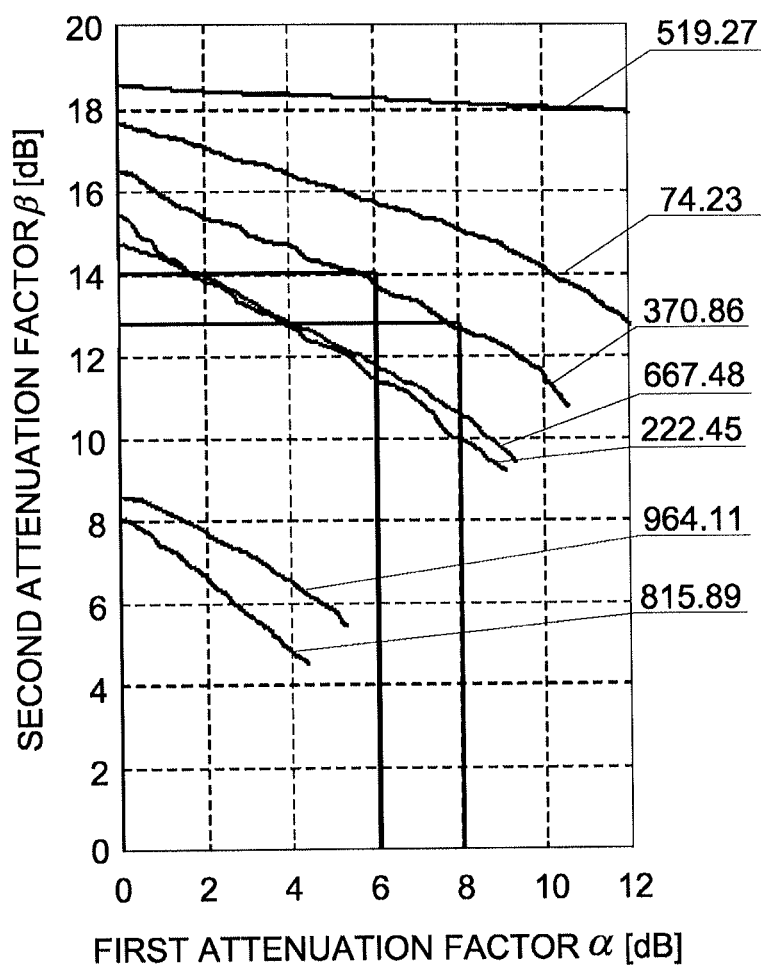
FIG. 9 is an explanatory diagram for correspondence relation prescription information that is used in the measurement calculation process of FIG. 8.

Specifically, for the printed circuit 40 (in which a multi-layer board is used) having a standard structure, a combination of the first attenuation factor $\alpha$ and the second attenuation factor $\beta$ by which the far electric field intensity E calculated by Formula (4) roughly coincides with the actual measurement value of the far electric field intensity is plotted for each frequency, and thereby, a graph illustrated in FIG. 9 is obtained. Here, each numerical value illustrated beside the graph is a frequency whose unit is MHz.

As is obvious from FIG. 9, when 6 and 12 are used as the first attenuation factor $\alpha$ and the second attenuation factor $\beta$ respectively, the far electric field intensity E calculated by Formula (4) can roughly coincide with the actual measurement value, in the case where the frequency is 667.48 MHz. However, in the case where the frequency is 370.86 MHz, when a combination of 6 and 14 or a combination of 8 and 12.8 is used as the combination of the first attenuation factor $\alpha$ and the second attenuation factor $\beta$, it is possible to calculate the far electric field intensity E closer to the actual measurement value than when the combination of 6 and 12 is used.

The correspondence relation prescription information to be set in the computation apparatus 30 is the information whose content is determined based on experimental results illustrated in FIG. 9 such that the combination of the first attenuation factor $\alpha$ and the second attenuation factor $\beta$ allowing the far electric field intensity E close to the actual measurement value to be evaluated can be specified from the marked frequency.

In the following, the content of the residual step of the measurement calculation process (FIG. 8) will be described.

The computation apparatus 30 after the process of step S406 judges whether the process for all evaluation target frequencies is completed (step S407). Then, in the case where the process for all evaluation target frequencies is not completed (step S407: NO), the computation apparatus 30 returns to step S402 to specify the next evaluation target frequency as the marked frequency, and then, performs the processes of step S403 and later.

When the process for all evaluation target frequencies is completed (step S407: YES), the computation apparatus 30 ends the measurement calculation process. Then, the computation apparatus 30 enters a state of accepting the instruction of the execution of the output process or the setting acceptance process.

As is obvious from the above description, the electric field intensity calculation system according to the embodiment is a system in which the calculation accuracy for the far electric field intensity with respect to each frequency is higher than the electric field intensity calculation system according to the second embodiment. Therefore, in the case of using the electric field intensity calculation system according to the embodiment, it is possible to prevent the EMC test from being unnecessarily performed, for example, at the time of the development of the printed circuit 40 in which a multi-layer board is used, more suitably than in the case of using the electric field intensity calculation system according to the second embodiment.

Fifth Embodiment

An electric field intensity calculation system according to a fifth embodiment of the present invention is a system in which the electric field intensity calculation system according to the fourth embodiment is improved such that a computation apparatus 30 performs a measurement calculation process with a procedure illustrated in FIG. 10.

The processes of steps S502 to S507 of the measurement calculation process each are processes having the same contents as the processes of steps S402 to S407 of the measurement calculation process (FIG. 8) that is performed by the computation apparatus 30 of the electric field intensity calculation system according to the fourth embodiment. Therefore, in the following, only the contents of the processes of steps S500 and S501 will be described.

As illustrated in FIG. 10, after starting the measurement calculation process, the computation apparatus 30 of the electric field intensity calculation system according to the embodiment performs a maximum intensity position specification process (step S500).

The maximum intensity position specification process is basically a process of measuring the intensity of a predetermined frequency component of the output while changing the position of the near magnetic field probe 11 and thereby specifying the coordinates of a position (hereinafter, referred to as a maximum intensity position) where the intensity of the predetermined frequency component is maximized. Here, for completing the process in a relatively short time, the maximum intensity position specification process is a process of specifying the coordinates of the maximum intensity position in the following procedure.

At the time of the maximum intensity position specification process, first, the near magnetic field probe 11 is moved at a relatively large interval (for example, an interval that is several times larger than the measurement interval set by the user), and a range in which the intensity of the above predetermined frequency component is high is specified. Thereafter, the near magnetic field probe 11 is moved in the range, at an interval smaller than the measurement interval set by the user, and the coordinates of the maximum intensity position are specified.

When the maximum intensity position specification process is completed, the computation apparatus 30 performs an evaluation target frequency component intensity measurement process (step S501). The evaluation target frequency component intensity measurement process is essentially the same process as the process (FIG. 1) of steps S101 to S104.

Here, at the time of the calculation of the coordinates of the measurement points in the evaluation target frequency component intensity measurement process according to the embodiment (that is, at the time of the execution of a step corresponding to step S101), there is also performed a process of shifting the calculated coordinates of the measurement points as a whole such that the maximum intensity position coincides with either of the measurement points.

In short, the electric field intensity calculation system according to the fourth embodiment is a system in which the positions of the measurement points at the time of the measurement calculation process are determined by the measurement range and measurement interval for the near magnetic field set by the user and the position of the evaluation target printed circuit 40 on the table 13. Therefore, in the electric field intensity calculation system according to the fourth embodiment, the maximum intensity position is at the center part of four measurement points, and therefore, a lower value than the actual maximum intensity is sometimes specified as the "maximum intensity". Then, in the case where a lower value than the actual maximum intensity is specified as the "maximum intensity", the value of $i_d$ is an inexact value, and therefore, the calculation accuracy for the far electric field intensity E decreases.

In contrast, in the case of performing the maximum intensity position specification process and evaluation target frequency component intensity measurement process having the above contents, it is possible to exactly evaluate the value of $i_d$ at all times. Therefore, the electric field intensity calculation system according to the embodiment, which performs the maximum intensity position specification process and evaluation target frequency component intensity measurement process having the above contents, does not produce the "decrease in the calculation accuracy for the far electric field intensity E due to an inadequate position of the measurement point for the near magnetic field intensity", which can be produced in the electric field intensity calculation system according to the fourth embodiment.

<<Modified Mode>>

In the above electric field intensity calculation systems according to the embodiments, various modifications can be performed. For example, a function of performing the measurement calculation process of FIG. 3 (the process of calculating the far electric field intensity of the printed circuit 40 in which a single-layer board is used) can be added to the computation apparatuses 30 of the electric field intensity calculation system according to the second to fifth embodiments. Also, a function of performing the maximum intensity position specification process or the like can be added to the computation apparatuses 30 of the electric field intensity calculation systems according to the first to third embodiments.

Also, a function of calculating the intensity of the electric field emitted diagonally from the printed circuit 30 to the board surface (that is, E sin θ; θ is the angle between the observation position for the electric field intensity and a normal line to the board of the printed circuit 40) can be added to the computation apparatuses 30 of the electric field intensity calculation systems according to the embodiments. Further, in a high frequency region (several GHz), the vertical directionality of the electric field to be emitted from the printed circuit 40 increases, and as a result, an error of the electric field intensity calculated by Formula (1) or Formula (3) can be large. Therefore, it is allowable to measure the vertical near magnetic field distribution of the printed circuit 40 by changing the height of the near magnetic field probe 11, to estimate the intensity of the electric field emitted vertically from the printed circuit 40, based on the measurement result, and to correct the electric field intensity calculated by Formula (1) or Formula (3), using the estimation result.

REFERENCE SIGNS LIST 10 near magnetic field measurement apparatus
11 near magnetic field probe
12 preamplifier
13 table
20 spectrum analyzer
30 computation apparatus
31 CPU
33 HDD
35 electric field intensity calculation program
40 printed circuit
50 anechoic chamber

The invention claimed is:

1. An electric field intensity calculation apparatus, comprising:
   a specification means for specifying, by analyzing a measurement result for a near magnetic field intensity distribution on a component side of a printed circuit, a maximum intensity of an evaluation target frequency component of a near magnetic field of the printed circuit and an area S1 of a range on the printed circuit which is delimited by using, as its boundary, positions where intensity of the evaluation target frequency component of the near magnetic field of the printed circuit attenuates by a first predetermined factor relative to the maximum intensity; and
   a calculation means for calculating a far electric field intensity E of the printed circuit, by a following calculation formula, using the area S1, an electric current value id, a distance r, an evaluation target frequency f and a previously set coefficient $K_d$, the far electric field intensity E being a far electric field intensity for the evaluation target frequency at a place that is distant by the distance r, the electric current value $i_d$ being an electric current value of electric current that generates a near magnetic field having the maximum intensity when flowing through the component side of the printed circuit.

$$E = K_d \cdot \frac{S1 \cdot i_d \cdot f^2}{r}.$$

2. The electric field intensity calculation apparatus according to claim 1, wherein
   the first predetermined factor is ½.

3. An electric field intensity calculation apparatus, comprising:
   a specification means for specifying, by analyzing a measurement result for a near magnetic field intensity distribution on a component side of a printed circuit, a maximum intensity of an evaluation target frequency component of a near magnetic field of the printed circuit, an area S1 of a range on the printed circuit which is delimited by using, as its boundary, positions where intensity of the evaluation target frequency component of the near magnetic field of the printed circuit attenuates by a first predetermined factor relative to the maximum intensity and an area S2 of a range on the printed circuit which is delimited by using, as its boundary, positions where intensity of the evaluation target frequency component of the near magnetic field of the printed circuit attenuates by a second predetermined factor relative to the maximum intensity; and
   a calculation means for calculating a far electric field intensity E of the printed circuit, by a following calculation formula, using the area S1, the area S2, an electric current value id, a distance r, an evaluation target frequency f and a previously set coefficient $K_d$, the far electric field intensity E being a far electric field intensity for the evaluation target frequency at a place that is distant by the distance r, the electric current value $i_d$ being an electric current value of electric current that generates a near magnetic field having the maximum intensity when flowing through the component side of the printed circuit.

$$E = K_d \cdot \frac{(S1 + S2) \cdot i_d \cdot f^2}{r}.$$

4. The electric field intensity calculation apparatus according to claim 3, wherein
   the first predetermined factor is ½, and the second predetermined factor is ¼.

5. The electric field intensity calculation apparatus according to claim 3, wherein
   the specification means specifies the maximum intensity, the area S1 and the area S2 for each of multiple evaluation target frequencies that are different from each other, and
   the calculation means calculates the far electric field intensity E, using the calculation formula, for each of the multiple evaluation target frequencies.

6. The electric field intensity calculation apparatus according to claim 3, wherein
   the specification means specifies the area S1 and the area S2, using a pair of values associated with the evaluation target frequency as the first predetermined factor and the second predetermined factor, for each of multiple evaluation target frequencies that are different from each other, and
   the calculation means calculates the far electric field intensity E, using the calculation formula, for each of the multiple evaluation target frequencies.

7. The electric field intensity calculation apparatus according to claim 5, further comprising,
   a correction means for performing a correction by an amount appropriate for the evaluation target frequency, to the far electric field intensity E calculated by the calculation means for an evaluation target frequency that is lower than a predetermined frequency.

8. The electric field intensity calculation apparatus according to claim 3, further comprising,
   a control means for controlling a measurement apparatus that is connected with the computer and that measures the near magnetic field intensity distribution on the circuit side of the printed circuit, by changing a relative position of a near magnetic field probe to the printed circuit.

9. The electric field intensity calculation apparatus according to claim 8, wherein
   the control means searches a spot that is on the printed circuit and where the intensity of the evaluation target frequency component of the near magnetic field is maximized, by controlling the measurement apparatus, before obtaining the measurement result for the near magnetic field intensity distribution on the component side of the printed circuit, and controls the measurement apparatus such that near magnetic field intensities at multiple spots are measured by the near magnetic field probe, when obtaining the measurement result for the near magnetic field intensity distribution on the component side of the printed circuit, the multiple spots including the searched spot and being arrayed in a lattice pattern.

10. An electric field intensity calculation method implemented by a computer comprising:

specifying, by analyzing a measurement result for a near magnetic field intensity distribution on a component side of a printed circuit, a maximum intensity of an evaluation target frequency component of a near magnetic field of the printed circuit, an area S1 of a range on the printed circuit which is delimited by using, as its boundary, positions where intensity of the evaluation target frequency component of the near magnetic field of the printed circuit attenuates by a first predetermined factor relative to the maximum intensity and an area S2 of a range on the printed circuit which is delimited by using, as its boundary, positions where intensity of the evaluation target frequency component of the near magnetic field of the printed circuit attenuates by a second predetermined factor relative to the maximum intensity; and calculating a far electric field intensity E of the printed circuit, by a following calculation formula, using the area S1, the area S2, an electric current value $i_d$, a distance r, an evaluation target frequency f and a previously set coefficient $K_d$, the far electric field intensity E being a far electric field intensity for the evaluation target frequency at a place that is distant by the distance r, the electric current value $i_d$ being an electric current value of electric current that generates a near magnetic field having the maximum intensity when flowing through the component side of the printed circuit $$E = K_d \cdot \frac{(S1 + S2) \cdot i_d \cdot f^2}{r}.$$

* * * * *